(12) United States Patent
Stünkel et al.

(10) Patent No.: US 8,874,421 B2
(45) Date of Patent: Oct. 28, 2014

(54) TEST SYSTEM COMBINATION FOR TESTING SEVERAL SYSTEMS UNDER TEST IN PARALLEL, COMPRISING SEVERAL TEST SYSTEMS

(75) Inventors: Reiner Stünkel, Hamburg (DE); Ralph Lembcke, Hamburg (DE)

(73) Assignee: Airbus Operations GmbH (DE)

( * ) Notice: Subject to any disclaimer, the term of this patent is extended or adjusted under 35 U.S.C. 154(b) by 1249 days.

(21) Appl. No.: 12/665,965

(22) PCT Filed: Jun. 24, 2008

(86) PCT No.: PCT/EP2008/057993
§ 371 (c)(1),
(2), (4) Date: Feb. 1, 2010

(87) PCT Pub. No.: WO2009/000822
PCT Pub. Date: Dec. 31, 2008

(65) Prior Publication Data
US 2010/0174522 A1    Jul. 8, 2010

Related U.S. Application Data

(60) Provisional application No. 60/937,246, filed on Jun. 25, 2007.

(30) Foreign Application Priority Data

Jun. 25, 2007    (DE) .......................... 10 2007 029 137

(51) Int. Cl.
G06F 17/50    (2006.01)
G06G 7/62    (2006.01)
G01R 31/00    (2006.01)

(52) U.S. Cl.
CPC .................................. *G01R 31/008* (2013.01)
USPC .......................................................... 703/13

(58) Field of Classification Search
None
See application file for complete search history.

(56) References Cited

U.S. PATENT DOCUMENTS

| | | | | |
|---|---|---|---|---|
| 5,023,791 A * | 6/1991 | Herzberg et al. | ............ | 701/33.4 |
| 5,111,402 A * | 5/1992 | Brooks et al. | ................ | 701/29.2 |
| 5,260,874 A * | 11/1993 | Berner et al. | ................... | 701/36 |
| 5,541,863 A * | 7/1996 | Magor et al. | ................... | 702/122 |
| 6,151,567 A * | 11/2000 | Ames et al. | ..................... | 703/13 |
| 7,908,531 B2 * | 3/2011 | Fairbanks et al. | ............. | 714/724 |
| 2001/0052766 A1 | 12/2001 | Drescher et al. | | |
| 2005/0256662 A1 | 11/2005 | Alder | | |
| 2006/0038084 A1 | 2/2006 | Fussell et al. | | |
| 2006/0043976 A1 | 3/2006 | Gervais | | |

FOREIGN PATENT DOCUMENTS

| | | |
|---|---|---|
| DE | 69326695 T2 | 2/2000 |
| EP | 0652526 A1 | 5/1995 |
| WO | 2006081869 A1 | 8/2006 |

* cited by examiner

*Primary Examiner* — Omar Fernandez Rivas
*Assistant Examiner* — Herng-Der Day
(74) *Attorney, Agent, or Firm* — Lerner, David, Littenberg, Krumholz & Mentlik, LLP

(57) ABSTRACT

Modern high-end technology products such as aircraft consist of a number of individual systems that are controlled by independent electronic control units and increasingly interconnected. According to one exemplary embodiment of the present invention, a test system assembly for testing several such systems for an aircraft in parallel is disclosed, wherein a master network is provided in order to exchange data between the individual test systems and a control unit, and wherein original electrical wiring is provided between the test systems in order to directly interconnect the tested systems. The flexibility of system tests for aircraft may be increased in this fashion.

16 Claims, 4 Drawing Sheets

Blockschaltbild Test System

TEST SYSTEM COMBINATION FOR TESTING SEVERAL SYSTEMS UNDER TEST IN PARALLEL, COMPRISING SEVERAL TEST SYSTEMS

CROSS-REFERENCE TO RELATED APPLICATIONS

This application is a national phase entry under 35 U.S.C. §371 of International Application No. PCT/EP2008/057993, filed Jun. 24, 2008, published in German, which claims the benefit of the filing date of U.S. Provisional Patent Application No. 60/937,246 filed 25 Jun. 2007, and German Patent Application No. 10 2007 029 137.1, filed 25 Jun. 2007, the disclosures of which applications are hereby incorporated herein by reference.

FIELD OF THE INVENTION

The present invention pertains to test systems. The present invention specifically pertains to a test system assembly for testing several systems under test in parallel, the utilization of a test system assembly in an aircraft and an aircraft or components of an aircraft that is/are connected to a test system assembly.

TECHNOLOGICAL BACKGROUND OF THE INVENTION

Test systems for electrical controllers that are also referred to as Systems under Test (SuT) in the following, may consist, for example, of so-called avionics components and are characterized in that the test systems are able to recreate or simulate the original environment of the system under test. For this purpose, the test systems may suitably measure the actions of the system under test and calculate from these actions and other parameters the reactions of the simulated environment of the system under test to these actions in order to subsequently stimulate the system under test accordingly.

The test system is used for simulating a normal system environment for the system under test, as well as for testing the reaction of the system under test to extreme and defective system environments that cannot be produced in the real operating environment of the system under test or only produced with considerable effort or in disproportionately hazardous situations.

Today's test systems are usually designed for the purpose of essentially testing a single system under test at a certain time. In this case, the system under test may consist of several components and vary with respect to its complexity between a few input/output (IO) signals and several hundred IO-signals.

These test systems typically result in a fixed allocation between systems under test, test systems and control unit. In addition, the scalability and the computing power may be limited. Joint tests of several different systems under test frequently can only be carried out under more difficult conditions.

SUMMARY OF THE INVENTION

An objective of the present invention consists of disclosing an improved test of systems for aircraft.

Disclosed is a test system assembly for an aircraft for testing several systems under test in parallel, the utilization of a test system assembly in an aircraft, as well as an aircraft or components of an aircraft that is/are connected to such a test system assembly according to the characteristics of the independent claims.

The exemplary embodiments of the test system assembly described below likewise pertain to the utilization of the test system assembly in an aircraft, as well as to the aircraft connected to a test system assembly.

According to one exemplary embodiment of the present invention, a test system assembly for testing several systems under test for an aircraft in parallel is disclosed, wherein the test system assembly features a first test system for simulating a first electrical environment of a first system under test, a second test system for simulating a second electrical environment of a second system under test and a master network that is designed for the data exchange between the first and the second test system and for the data exchange with a workstation for controlling test sequences.

In other words, the test system assembly features several individual test systems that may respectively simulate or represent a certain electrical environment of a certain system under test. The test systems thusly replace corresponding sensors, actuators and other systems and simulate the signals output by these components.

The individual test systems are connected to a master network and connected to one another, as well as to a work- or control station, via this network. This master network is also referred to as Data Distribution Layer (DDL) and makes it possible to realize a centralized control of the individual test systems, as well as the data exchange between any test systems.

The master network may be realized, for example, in the form of a data bus. Protocol data with respect to the test (measuring data) is transferred from the test systems to the workstation or a corresponding memory via this network. The test is also controlled via the master network. In this case, the test systems are active and supply the systems under test with corresponding signals. For example, complex simulations may be respectively implemented on one individual test system, wherein control loops that are critical in terms of real time are, for example, also respectively implemented in one individual test system such that a time delay caused by the data transport via the network is avoided and the reaction time may be shortened accordingly.

According to another exemplary embodiment of the present invention, the network is designed for transmitting management and control parameters of a test sequence only. In this case, strict real time requirements may be handled on one test system while the real time requirements with respect to the data exchange of the remaining data via the DDL are less critical.

According to another exemplary embodiment of the present invention, each test system is designed for the data exchange with every other test system and with the workstation.

This enables all test systems to communicate with one another and with the workstation. An arbitrarily complex simulation of the original environment may be realized in this fashion.

According to another exemplary embodiment of the present invention, a third test system is provided for simulating a third electrical environment of the first system under test.

Consequently, the first system under test is connected to at least two different test systems that respectively simulate a certain sensor or a certain actuator or another system. The different test systems can be activated or deactivated independently of one another such that completely different test scenarios can be realized. All these test systems are connected to one another by means of the master network and can be controlled, adjusted or programmed from corresponding control stations (such as the workstation).

According to another exemplary embodiment of the present invention, the first test system is designed for assuming or simulating a closed functionality of the first system under test.

Consequently, this makes it possible for each test system to replace a certain sensor, actuator, a certain group of cooperating sensors/actuators, subsystems or partial systems, etc.

A realistic simulation may be achieved in this fashion.

According to another exemplary embodiment of the present invention, the test systems feature switches or corresponding elements that serve for switching through signals of the systems under test to other systems. These other systems correspond, for example, to the original systems in the aircraft that are connected to the systems under test in the operating state of the aircraft.

Individual test systems can be purposefully excluded from the simulation in this fashion. This makes it possible to adjust completely different test configurations. The switch is controlled, for example, from the workstation or another external controller.

According to another exemplary embodiment of the present invention, the workstation is designed for controlling and configuring the test sequences.

For example, pre-programmed test sequences may be stored in the workstation. It is also possible for a user to input certain test sequences at the workstation during or shortly before the test.

According to another exemplary embodiment of the present invention, the test system assembly furthermore features a data memory for storing measuring data resulting from the test sequence. The data memory is connected to the test systems via the network in this case.

According to another exemplary embodiment of the present invention, the test system assembly features another workstation for monitoring and controlling other test sequences.

In this case, several tests of different systems under test can be carried out simultaneously and independently of one another.

According to another exemplary embodiment of the present invention, the test system assembly features another test system for controlling the first test system and for carrying out a simulation calculation.

For example, this additional test system does not feature an interface with the systems under test. Consequently, the additional test system can carry out, for example, a computation-bound simulation and make the results available to other test systems.

According to another exemplary embodiment of the present invention, the test system assembly has an online operating mode, in which the test systems simulate an original environment of the systems under test.

In the online operating mode, the test systems simulate the original environment of the systems under test. Process data is exchanged between the test systems and the workstation(s) and data memory/memories. The exchange of process data in the online operating mode generally fulfills real time conditions. The data exchange in the online operating mode is realized with the Online Data Exchange Interface functionality of the DDL interface of the respective test systems and workstations.

According to another exemplary embodiment of the present invention, the test system assembly has an offline operating mode, in which a configuration of the test systems can be carried out in order to prepare for a new test sequence.

Consequently, a new test case is prepared in the offline operating mode. The different test systems are configured. Simulations are loaded on the test systems and the systems under test are interconnected. The test systems have a neutral behavior referred to the systems under test. Configuration data is exchanged between the test systems and the workstations. The data exchange in the offline operating mode is realized with the management interface functionality of the DDL interface of the respective test systems and workstations.

The test system assembly therefore has two essential operating modes, namely the online operating mode and the offline operating mode.

It is also possible to realize a mixed operating mode, in which selected test systems are configured, i.e., prepared for a test case. However, other selected test systems carry out a certain simulation or a certain test sequence. Consequently, a parallel functionality is realized that makes it possible to configure a certain section of the test system assembly for a new test case while another section of the test system assembly already or still carries out a certain simulation.

The test time may be a significantly shortened in this fashion.

According to another exemplary embodiment of the present invention, the test system assembly furthermore features electrical wiring that is true to the original connection between the systems under test.

The integration of the original electrical wiring into the test system assembly provides the advantage, for example, that defects in the electrical wiring and the interconnection between the individual systems can also be detected. Consequently, it is also possible to detect defects that result, for example, from the physical properties of the interconnection between the systems such as, e.g., different variations or interpretations of signal levels or timing problems in bus connections. It is also possible to carry out physically representative measurements of all signals.

Due to the different test systems, the systems under test can be flexibly tested in any combination. Several systems under test can be tested jointly at a certain time.

According to another exemplary embodiment of the present invention, the test system assembly is designed for providing measuring data with a time stamp corresponding to the time of an event that is correlated with the measuring data.

Consequently, the time history of all measured input/output signals can also be exactly reconstructed in the test system assembly.

According to another exemplary embodiment of the present invention, the network features a subgroup that serves for exchanging process variables only between the test systems. According to another exemplary embodiment of the present invention, the test systems are interconnected such that they respectively simulate a system under test in its entirety and the test system assembly can carry out tests of the connected system without the presence of original components (Virtual System Integration).

According to another exemplary embodiment of the present invention, a test system for a test system assembly is disclosed, wherein said test system is designed for outputting an inventory report on a status of a hardware equipment and on properties of this hardware, as well as for outputting an inventory report on all simulations loaded in the test system and their properties.

According to another exemplary embodiment of the present invention, the utilization of a test system assembly in an aircraft is disclosed.

Furthermore, an aircraft connected to an above-described test system assembly is disclosed.

Preferred exemplary embodiments of the present invention are described below with reference to the figures.

SHORT DESCRIPTION OF THE FIGURES

DETAILED DESCRIPTION OF EXEMPLARY EMBODIMENTS

The figures show schematic illustrations that are not true-to-scale.

In the following description of the figures, identical or similar elements are identified by the same reference symbols.

Figure 1:
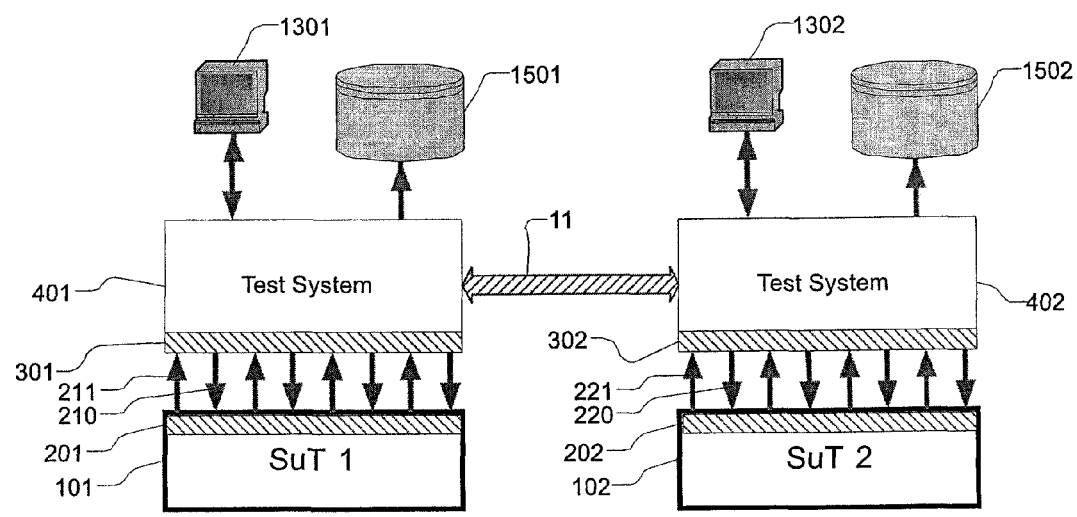
FIG. 1 shows a schematic representation of test systems according to the current state of the art.

FIG. 1 shows test systems 401, 402 that are optimized for testing a closed system under test 101 or 102, respectively.

The systems under test 101, 102 usually consist of an avionics system controller or computer. In addition, each test system 401, 402 features an electrical interface 301, 302 that is respectively connected to an electrical interface 201, 202 of the system under test 101, 102 via the electrical wiring 210, 211, 220, 221. In the operating state of the systems under test, the interfaces 201, 202 of the systems under test are connected to sensors, actuators and other systems. In the test state, they are connected to the corresponding test systems 401, 402 that simulate these sensors, actuators or other systems.

The test systems 401, 402 serve for simulating the electrical environment of the systems under test 101, 102. In addition, a connection between the test systems 401, 402 can be realized in the form of an interface 11. The definition of the data exchange on this interface 11 usually needs to be agreed upon on both test systems.

The test systems 401, 402 are connected to workstations 1301, 1302 for monitoring and controlling the tests and the test system or test systems via data lines. In addition, data memories 1501, 1502 are provided for storing measuring data of the test systems 401, 402.

The test systems can react to events at their inputs in real time. All input/output signals are processed in one test system. The control and configuration is intimately connected to the test system. The data storage allows a precise reconstruction of the time histories of events and is intimately connected to the test system.

Figure 2:
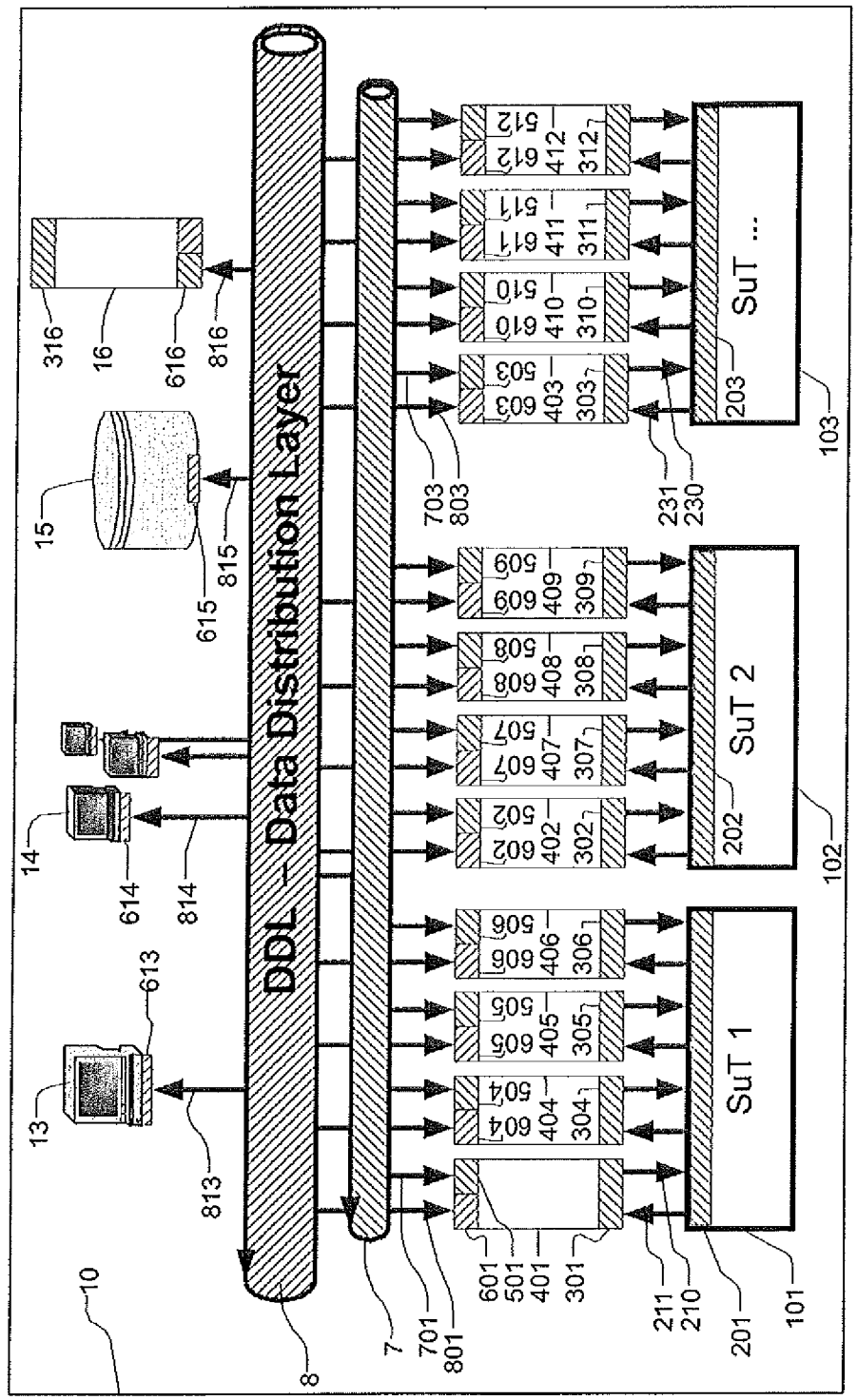
FIG. 2 shows a test system assembly according to one exemplary embodiment of the present invention for testing several systems under test in parallel with several test systems.

FIG. 2 shows a test system architecture or a test system assembly 10 for testing several systems under test in parallel with several test systems according to one exemplary embodiment of the present invention. The test system assembly 10 features a number of individual test systems 401 to 412 that are respectively connected to certain systems under test 101, 102, 103. In addition, the individual test systems 401 to 412 are connected to the original electrical wiring 7 of the aircraft. All test systems 401 to 412 are connected to the master network 8 that enables the test systems to exchange data with one another, with the control units 13, 14, with a data memory 15 or with an additional test system 16.

The communication between the test systems, the systems under test, the control units 13, 14, the additional test systems 16 and the data memories 15 may take place bidirectionally.

The systems under test 101, 102, 103 usually consist of avionics system controllers/computers. The arrows 210, 211-231 simulate the electrical interfaces 201-203 of the systems under test 101-103 with the original sensors, actuators and other systems or with a test system in the test state.

Each of the test systems 401 to 412 serves for simulating the electrical environment of the assigned system under test and features a corresponding interface 301-312 with the assigned system under test.

In addition, the test systems 401 to 412 feature Original Equipment Interfaces, for example, the interface 501 of the test system 401 or the interface 512 of the test system 412. The electrical interfaces of the systems under test can be connected to the corresponding interfaces of other systems under test by means of the Original Equipment Interface. In a joint test case, the sum of all connected individual systems under test represents the complete "tested" system under test.

In addition, the test systems 401 to 412 feature interfaces with the network in order to realize the data exchange of the test systems (DDL) 8, for example, the interface 601 of the test system 401 or the interface 612 of the test system 412.

The reference symbols 7, 701-712 show the electrical wiring that is true to the original connection of interconnected systems under test. This electrical wiring consists of original electrical wiring that is also installed in the aircraft or of electrically equivalent wiring.

The workstations 13, 14 are connected to the network 8 via corresponding interfaces 613, 614. The workstation 13 serves for monitoring and controlling the tests and the test systems. The other optional workstations 14 also serve for monitoring and control purposes such as, for example, for carrying out other, different test sequences.

In addition, data memories 15 are provided for storing measuring data and connected to the network 8 via an interface 615. Another optional test system 16 is also provided, wherein this test system is designed for controlling other test systems and for computation-bound simulations. For this purpose, the test system 16 not only features the interface with a system under test 316 (that is not connected), but also another interface 616 with the network 8.

Any stored or measured data is generally available for all measuring systems/test systems. The DDL-network 8 may be, for example, Ethernet.

Today's high-end technology products such as aircraft, automobiles or railroads consist of a number of individual systems that are controlled by independent electronic controllers and increasingly interconnected. The test system assembly is able to test individual systems and any combinations of individual systems up to the complete assembly of all systems. The integration level for the respective test therefore can be arbitrarily configured.

This allows a flexible and individual test sequence that may also be immediately adapted to any situation.

Instead of being connected to a single test system, the system under test is connected to one or several smaller test systems. In this case, each test system usually fulfills certain functionalities of the system under test that are largely closed such as, e.g., the interface of the system under test with another system or a certain group of sensors and actuators that cooperate in the real environment. The test system is able to simulate the real environment or to switch through the signals of the system under test to other systems such as, e.g., original components of the system or other systems.

All test systems are connected to one another, as well as to the control workstation and to the data memory, via a network (DDL). Each test system can exchange data with any other test system and with the control via the DDL.

Each system under test can be tested by itself. In this case, the complete environment of the system under test is simulated on the test systems that are connected to this system under test and configured and managed from the control workstation.

Each system under test may be tested jointly with any combination of other systems under test. In this case, the test systems that simulate the respective system interfaces switch through and the involved systems under test are connected directly and true to the original connections. The remainder of the environment of the systems under test is simulated by the test systems. The workstation serves, for example, for control purposes and manages the test of the different systems.

The data storage is realized in a centralized fashion in the test system assembly by means of the DDL.

Other workstations may be optionally provided for control purposes. In this case, it would be possible, in principle, to carry out several tests of different systems under test simultaneously and independently of one another.

Other test systems that do not feature an interface with systems under test may be optionally provided. These other test systems may carry out, e.g., computation-bound simulations and make the results available to the other test systems.

Even tests without the presence of physical systems under test may be optionally carried out, e.g., in order to simulate the interaction between different systems under test being developed in advance.

All connected test systems feature an interface with the DDL network. The standardization of the interface functionalities of all systems connected to the DDL is ensured in order to jointly utilize the test system assembly. The DDL transports the data between all connected test systems and workstations.

All test systems and workstations connected via the DDL follow a standard behavior model (Behavior Model) such that the test system assembly functions in an optimally usable fashion. The behavior model defines the rules of interaction between all components.

The complete description of the DDL therefore controls the management interface, the Online Data Exchange Interface and the basic behavior model of all components.

As described above, a test system assembly requires quite some attention with respect to its conception and specific design. In order to prevent the DDL from turning into a bottleneck, it is important to implement complete simulations on an individual test system. It is furthermore advantageous to carry out, e.g., control loops that are critical in terms of real time in an individual test system because the time delay caused by the data transport via the DDL is eliminated and the reaction time consequently can be shortened.

An advantageous design is achieved if the exchange of process data via the DDL is limited to the management and control parameters of the simulation. In this case, it would be possible to handle strict real time requirements on one test system while the real time requirements with respect to the data exchange via the DDL are much more relaxed. This can be achieved with a corresponding partitioning of the simulations and IOs over the test systems.

In order to also exactly reconstruct the time history of all measured input/output signals in the test system assembly, it is necessary to store all events at the IOs with the exact time of their occurrence (so-called time stamp). If the IO-events are stored with a time stamp, the transport of data to the data memory via the DDL is no longer time-critical. However, this would require the clocks of all test systems in the assembly to be synchronized with an accuracy that is higher than the required temporal measuring resolution (for example, by more than a factor of 2).

This temporal synchronization of all clocks of the test systems is also ensured via the DDL.

Figure 3:
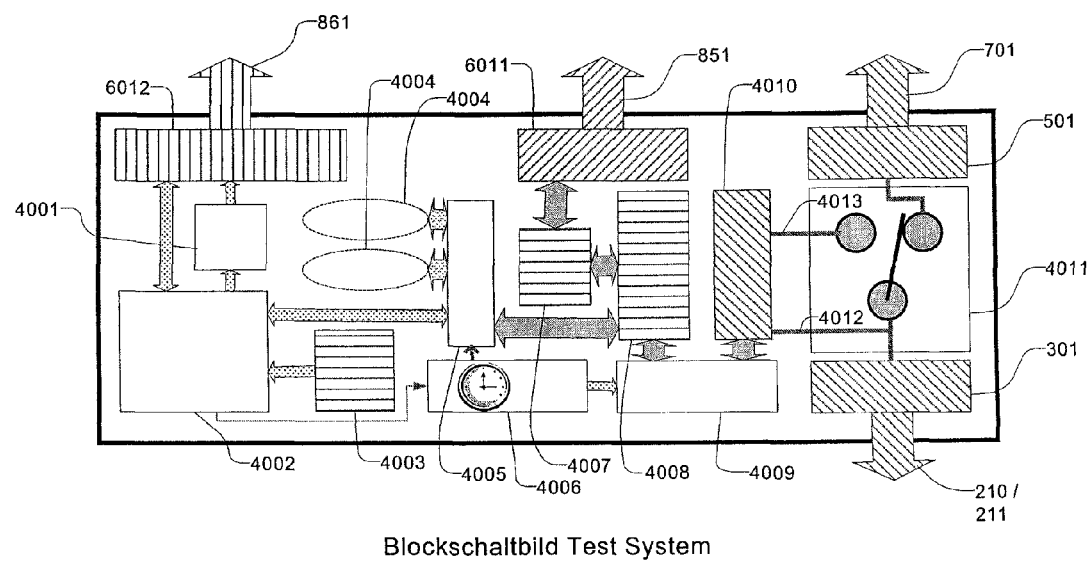
FIG. 3 shows a block diagram of a test system according to one exemplary embodiment of the present invention.

FIG. 3 shows a block diagram of a test system according to one exemplary embodiment of the present invention. The test system comprises the following components or functional blocks:

On the one hand, a management interface 6012 is provided. This management interface 6012 handles the communication with a workstation 13 in the offline mode. If no strict time requirements are specified, the exchange of the process data can also be handled via this interface. The management interface serves for defining the configuration of the test system, for forwarding error messages and for controlling the behavior of the test system. The data exchange with the workstation is symbolized with the arrow 861.

In addition, a unit 4001 is provided for error management purposes (so-called error-handler). The error-handler 4001 processes all error messages and forwards these error messages to the user via the management interface 6012.

The test system control 4002 serves for controlling all states of the test system independently of the inputs received via the management interface 6012, as well as the internal states of the complete system. Simulations 4004 can be loaded, started and stopped and the state of the test system can be queried.

The control 4002 is connected to the error-handler 4001, as well as directly connected to the management interface 6012. The error-handler 4001 in turn is connected to the management interface 6012.

In addition, a processing unit 4003 is provided (so-called inventory report processing), wherein this processing unit is connected and can deliver data to the control 4002. The test system precisely knows its capabilities and the currently loaded simulation. This information can be queried by means of the inventory report processing 4003. The loading and configuring of the test system is realized by inputting an (expanded) inventory report via the management interface 6012.

Simulations 4004 can be carried out. It may be possible, in principle, to execute any number of simulations 4004 that are linked by process variables and interact with the test system via the simulation interface (API) 4005 on the test system.

The simulations 4004 consequently may exchange data with the API 4005. The API 4005 in turn may exchange data with the control 4002 and the process variable list 4008.

The simulation API 4005 is an application program interface for simulations with a series of functions that are fulfilled by the interface between the simulations and the test system. In addition, the API 4005 is supplied with time data by the clock module 4006, e.g., in order to invoke simulations in a cyclic fashion or to allow a time-dependent behavior of the simulations.

The reference symbol 4006 identifies a time generation, time stamp and scheduler unit. The clocks of all test systems are synchronized via the management interface 6012. The clocks are required for planning the simulations and internal processes of the test systems, as well as for detecting the time of IO-events (time stamp).

In this case, the local time generation unit 4006 receives data from the control 4002 and delivers data to the API 4005, as well as to the IO-handler 4009.

In addition, a so-called subscription list 4007 is provided that contains all process variables requested/subscribed to by other test systems or the control 13 or the data memory 15. If a process variable in the subscription list is changed, it is transmitted to the receivers entered into the subscription list by the test system via the interface 6011 or 6012. The subscription list 4007 communicates with the interface with the DDL 6011 and with the process variable list 4008.

The reference symbol 6011 identifies the Online Data Exchange Interface with the DDL. The process variables are transported via this interface as symbolized by the arrow 851.

The process variable list 4008 is a list of all process variables in the test system and communicates with the IO-handler 4009.

The IO-handler 4009 makes available all IO-data, as well as all IO-control parameters, in the form of process variables and is bidirectionally connected to the unit 4010 for the physical IO-generation.

The unit 4010 performs the physical IO-generation and the monitoring (monitoring). For this purpose, data lines 4012 and 4013 are provided for connecting the unit 4010 to the switch 4011. The unit 4010 converts the process variables into physical signals and physically simulates a sensor or actuator (simulation). The signals of the SuT can be simulated and/or monitored (monitoring).

In addition, an interface 501 with original systems is provided that can be connected to the original systems as symbolized with the arrow 701. Consequently, it is possible to connect "Original Equipment." The system under test can be switched through to the original equipment in a direct and uninfluenced fashion. The signal flow can be observed with the monitoring function 4012 in this case.

The switch 4011 is provided for changing over between the operation of the SuT with simulations or with original equipment.

In addition, an interface 301 with the system under test is provided. The system to be tested is connected at this location as symbolized with the arrow 210/211. The data exchange also takes place bidirectionally in this case.

Advantages of the new architecture manifest themselves in the integration and the test of today's complex systems that are interconnected and dependent on many levels and used in modern high-end technology products such as aircraft, automobiles or railroads.

The test systems may be realized small and therefore cost-efficiently. The computers of the test systems may consist of standard components, e.g., on the basis of PCs or Compact-PCIs. The test systems can be used for the test on the system level (a system under test). The interconnection of any number of systems under test can also be tested.

The test system supports a connection of the systems under test that is true to the original connection. In this respect, an adequate representativeness is also ensured when testing several connected systems under test. All test systems feature the standard DDL-interface that allows a standardized operation and communication. The computing power can be scaled linearly with the test system. The test system assembly has a modular design such that individual components can be individually replaced or changed without influencing other components. Systems of different manufacturers can be interconnected by means of the DDL.

Figure 4:
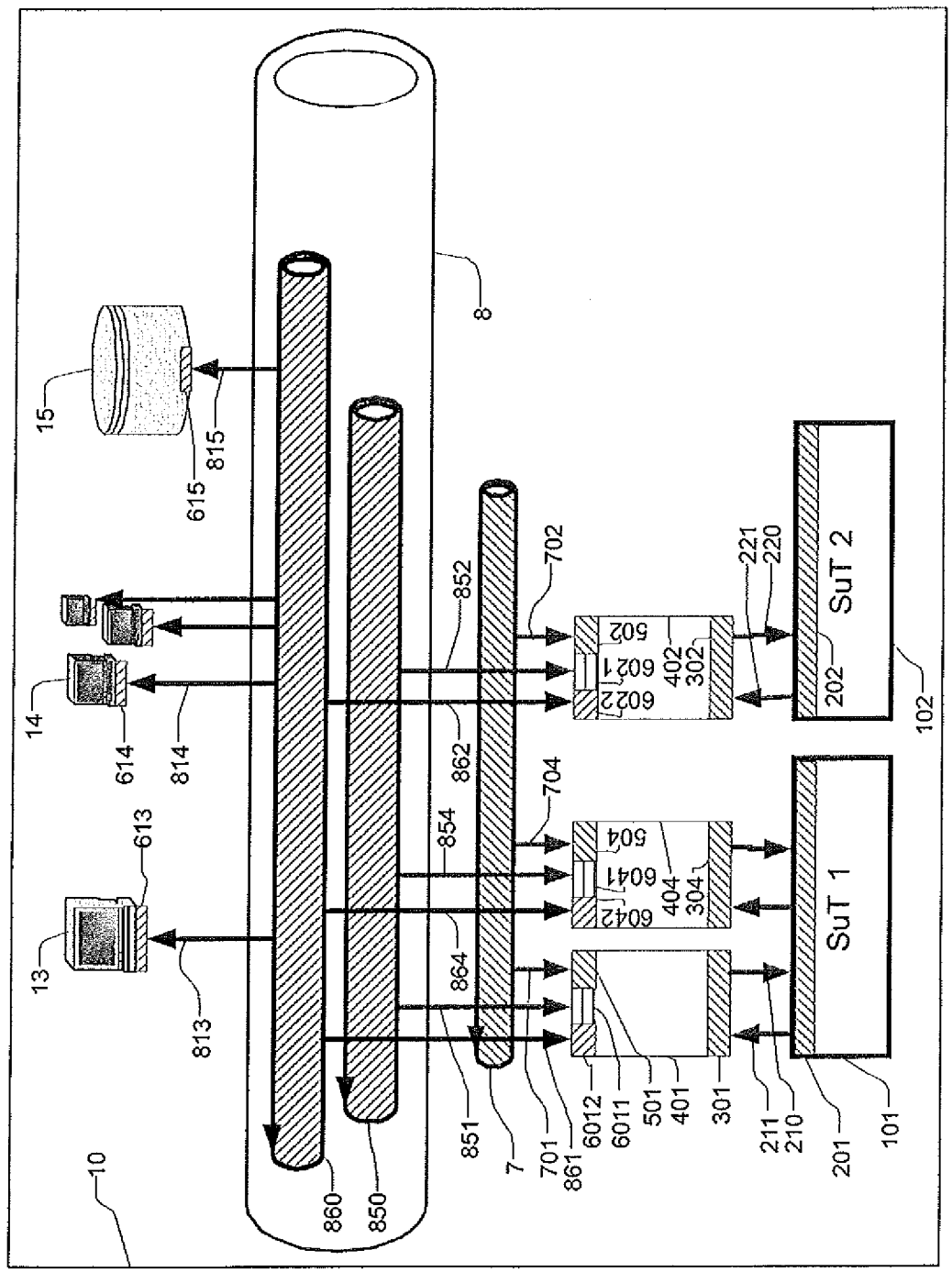
FIG. 4 shows another representation of a test system assembly according to one exemplary embodiment of the present invention.

FIG. 4 shows a test system according to another exemplary embodiment of the present invention. A workstation 13 and other optional workstations 14 are provided and connected to the DDL 8 via interfaces 613, 614. In this exemplary embodiment, the DDL 8 features two independent networks: the general network 860 and a special real time connection 850.

The workstations 13 and 14, as well as the data memory 15, are connected to the network 8, particularly to the non-real time subgroup 860. All management data, inventory report data and error messages are transmitted on this part of the network.

The network 8 also features a real time subgroup 850. The test systems 401-404 can communicate with one another bidirectionally via the real time subgroup 850. If corresponding measures are taken in the test systems in order to ensure that only process variables are transmitted via the real time subgroup 850 of the DDL network 8, that process variables furthermore are only transmitted if another test system actually wants to use this process variable and has informed the transmitting test system accordingly and that the communications demand is minimized due to a sensible partitioning of the simulations over the test systems, today's networks such as, e.g., Ethernet normally have a sufficient performance or capability for fulfilling the communication requirements for environmental simulations of complex connected systems.

An example of two systems under test 101, 102 is illustrated in the exemplary embodiment according to FIG. 4. The SuT 101 is connected to two test systems 401 and 404 while the SuT 102 is connected to only one test system 402. The SuTs can be directly connected to one another via the Original Equipment Interface 501, 504, 502 and the original electrical wiring 7, 701, 702 and 704 in order to be subsequently tested jointly or independently of one another.

The data memory 15 can be used for recording and evaluating the measuring data in all test cases.

The test system assembly can, in principle, be scaled arbitrarily, namely with respect to the number of test systems per SuT, as well as the number of SuTs. The available computing power therefore can be increased arbitrarily.

Figure 5:
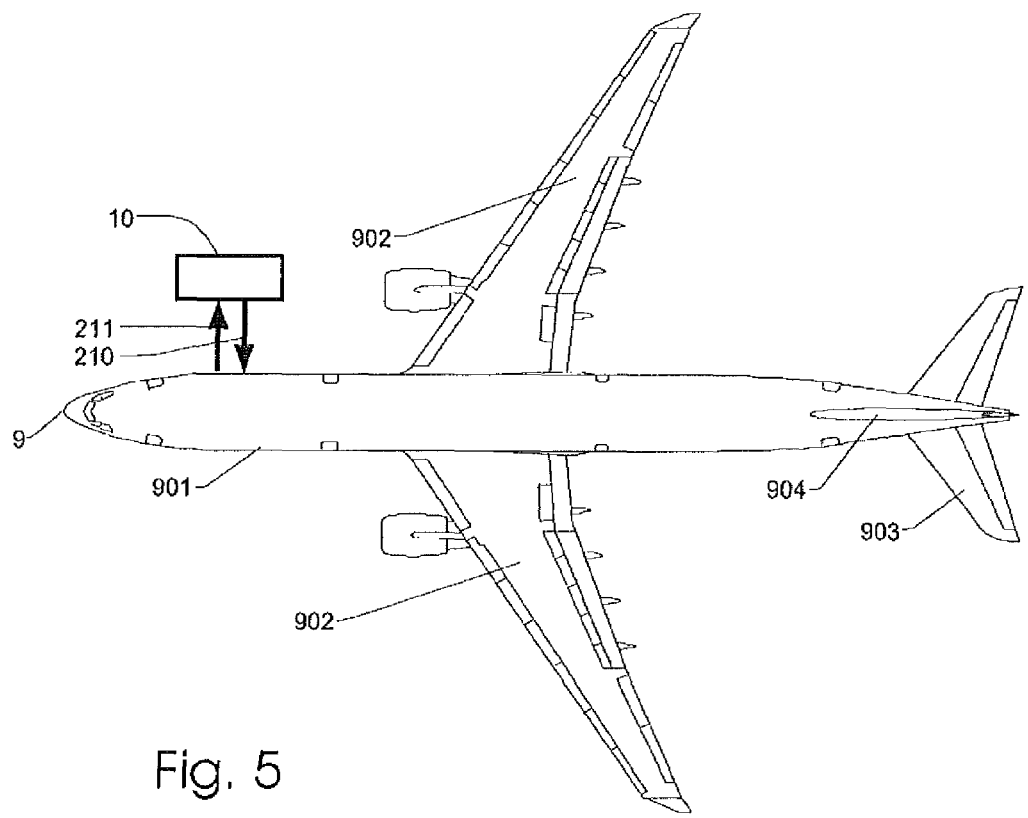
FIG. 5 shows an aircraft connected to a test system assembly according to one exemplary embodiment of the present invention.

FIG. 5 shows a top view of an aircraft according to an exemplary embodiment of the present invention. The aircraft 9 features a fuselage 901, airfoils 902, an elevator unit 903 and a rudder unit 904. The systems installed in the aircraft are connected to an inventive test system assembly 10. The test system assembly can be operated in the aircraft together with all devices and systems integrated into the aircraft such that tests can be carried out during the operation of the aircraft on the ground. The test system assembly can be used for testing the systems during the commissioning of the aircraft systems or of parts thereof. Instead of testing the entire aircraft, the inventive test system assembly can also be used for the commissioning and the testing of individual complete sections of the aircraft (sections) prior to the final assembly.

Figure 6:
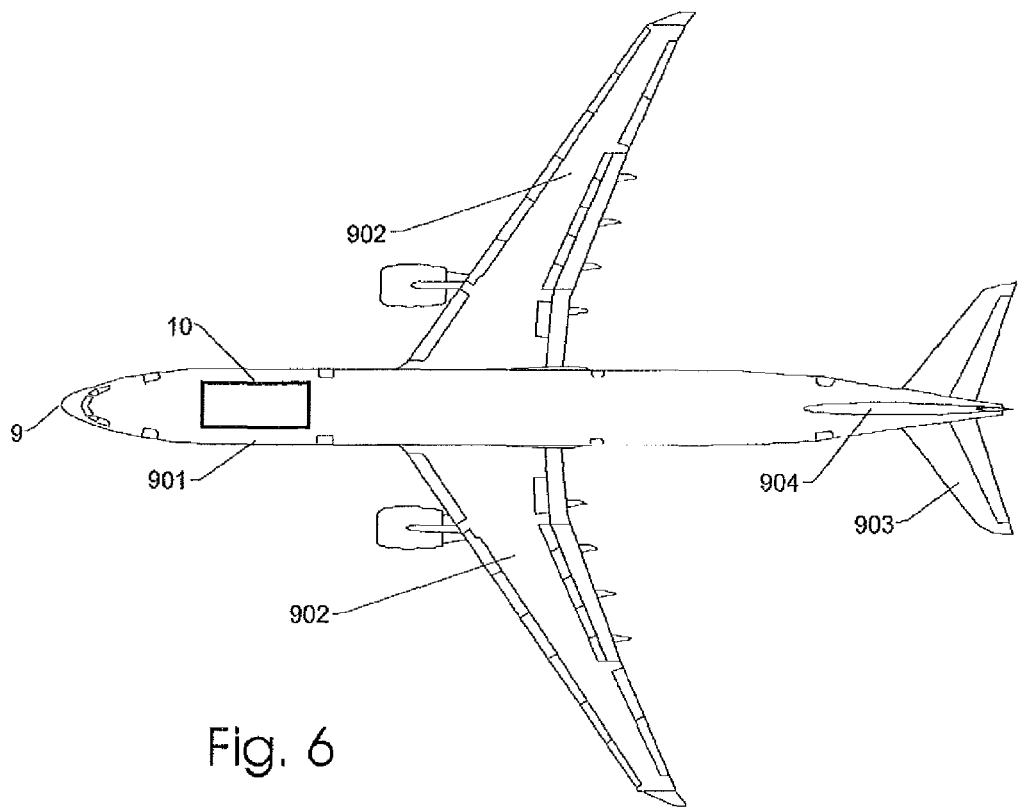
FIG. 6 shows a test system assembly according to one exemplary embodiment of the present invention that is used in an aircraft.

FIG. 6 shows a top view of an aircraft according to an exemplary embodiment of the present invention. The aircraft 9 features a fuselage 901, airfoils 902, an elevator unit 903, a rudder unit 904 and an inventive test system assembly 10. The test system assembly may be installed in the aircraft together with all devices and systems integrated into the aircraft such that tests can be carried out at any time, namely also during the operation of the aircraft.

As a supplement, it should be noted that "comprising" does not exclude any other elements or steps and that "an" or "a" does not exclude a plurality. It should furthermore be noted that characteristics or steps that were described with reference to one of the above exemplary embodiments can also be used in combination with other characteristics or steps of other above-described exemplary embodiments. The reference symbols in the claims should not be interpreted in a restrictive sense.

The invention claimed is:

1. A test system assembly for testing several systems under test for an aircraft in parallel, with the test system assembly comprising:
   a first test system for simulating a first electrical environment of a first system under test comprising a first electrical interface, the first test system comprising a second electrical interface;
   a second test system for simulating a second electrical environment of a second system under test comprising a third electrical interface, the second test system comprising a fourth electrical interface;
   a first electrical wiring connected to the first and second test systems; and
   a master network configured for data exchange between the first and second test systems and for data exchange with a workstation for controlling test sequences,
   wherein, during operation of the test system assembly, a second electrical wiring is connected to the first electrical interface and the second electrical interface, and a third electrical wiring is connected to the third electrical interface and the fourth electrical interface,
   wherein the first, second and third electrical wirings are original electrical wirings connecting the first and second systems under test installed in the aircraft, or
   wherein the first, second and third electrical wirings are electrically equivalent to the original electrical wirings connecting the first and second systems under test installed in the aircraft.

2. The test system assembly of claim 1,
   wherein the network is configured for transmitting management and control parameters of a test sequence only.

3. The test system assembly of claim 1,
   wherein each test system is configured for data exchange with every other test system and with the workstation.

4. The test system assembly of claim 1,
   further comprising a third test system for simulating a third electrical environment of the first system under test.

5. The test system assembly of claim 1,
   wherein the first test system is configured for assuming a closed functionality of the first system under test.

6. The test system assembly of claim 1,
   wherein the test systems include switches for switching through signals of the systems under test to other systems.

7. The test system assembly of claim 1,
   wherein the workstation is configured for controlling and configuring the test sequences.

8. The test system assembly of claim 1, further comprising:
   a data memory for storing measuring data resulting from the test sequence via the network.

9. The test system assembly of claim 1, further comprising:
   a second workstation for monitoring and controlling other test sequences.

10. The test system assembly of claim 1, further comprising:
    a third test system for controlling the first test system and for carrying out a simulation calculation.

11. The test system assembly of claim 1,
    wherein the test system assembly has an online operating mode, in which the test systems simulate an original environment of the systems under test.

12. The test system assembly of claim 1,
    wherein the test system assembly has an offline operating mode, in which a configuration of the test systems can be carried out in preparation for a new test sequence.

13. The test system assembly of claim 1, wherein the network comprises a subgroup that only serves for the exchange of process variables between the test systems.

14. The test system assembly of claim 1, wherein the test systems are interconnected in such a way that they respectively simulate a system under test in its entirety such that the test system assembly can carry out tests of the connected system without the presence of original components.

15. An aircraft connected to a test system assembly, the test system assembly comprising:
    a first test system for simulating a first electrical environment of a first system under test comprising a first electrical interface, the first test system comprising a second electrical interface;
    a second test system for simulating a second electrical environment of a second system under test comprising a third electrical interface, the second test system comprising a fourth electrical interface;
    a master network configured for data exchange between the first and second test systems and for data exchange with a workstation for controlling test sequences;
    a first electrical wiring connected to the first and second test systems;
    wherein, during operation of the test system assembly, a second electrical wiring is connected to the first electrical interface and the second electrical interface, and a third electrical wiring is connected to the third electrical interface and the fourth electrical interface,
    wherein the first, second and third electrical wirings are original electrical wirings connecting the first and second systems under test installed in the aircraft, or
    wherein the first, second and third electrical wirings are electrically equivalent to the original electrical wirings connecting the first and second systems under test installed in the aircraft.

16. A test system for a test system assembly, the test system assembly comprising:
    a first test system for simulating a first electrical environment of a first system under test comprising a first electrical interface, the first test system comprising a second electrical interface;
    a second test system for simulating a second electrical environment of a second system under test comprising a third electrical interface, the second test system comprising a fourth electrical interface;
    a master network configured for data exchange between the first and second test systems and for data exchange with a workstation for controlling test sequences; and
    a first electrical wiring connected to the first and second test systems;
    wherein, during operation of the test system assembly, a second electrical wiring is connected to the first electrical interface and the second electrical interface, and a third electrical wiring is connected to the third electrical interface and the fourth electrical interface,
    wherein the test system is configured for outputting an inventory report on a status of a hardware equipment and on properties of the hardware equipment, as well as for outputting an inventory report on all simulations loaded in the test system and the properties of all simulations, and wherein the first, second and third electrical wirings are original electrical wirings connecting the first and second systems under test installed in an aircraft, or wherein the first, second and third electrical wirings are electrically equivalent to the original electrical wirings connecting the first and second systems under test installed in the aircraft.

* * * * *